United States Patent [19]

Koyama et al.

[11] Patent Number: 5,703,582
[45] Date of Patent: Dec. 30, 1997

[54] DAC WITH FEEDBACK CONTROL FOR CURRENT SOURCE BIAS DURING NON-DISPLAY PERIOD

[75] Inventors: Seiji Koyama, Yamato; Tohru Nozawa, Sagamihara; Asao Terukina, Yamato; Yasusuke Suzuki, Kanagawa-ken, all of Japan

[73] Assignee: International Business Machines Corporation, Armonk, N.Y.

[21] Appl. No.: 627,663

[22] Filed: Apr. 1, 1996

[30] Foreign Application Priority Data

Mar. 31, 1995 [JP] Japan ................................. 7-075084

[51] Int. Cl.⁶ .......................... H03M 1/10; H03M 1/70
[52] U.S. Cl. .................... 341/120; 341/136; 341/153
[58] Field of Search ........................ 341/118, 120, 341/136, 144, 153, 154

[56] References Cited

U.S. PATENT DOCUMENTS

| | | | |
|---|---|---|---|
| 4,631,518 | 12/1986 | Caspell | 341/122 |
| 4,641,194 | 2/1987 | Hinn | 348/805 |
| 4,958,155 | 9/1990 | Gulczynski | 341/120 |
| 5,021,784 | 6/1991 | Groeneveld et al. | 341/120 |
| 5,570,090 | 10/1996 | Cummins | 341/144 |

OTHER PUBLICATIONS

Boiocchi et al., *Self-calibration in high speed current steering CMOS D/A converters*, Second International Conference on Advanced A-D and D-A Conversion Techniques and Applications, Cambridge, UK; Jul. 1994, IEE Publ. No. 393, pp. 148–152.

*Primary Examiner*—Howard L. Williams
*Attorney, Agent, or Firm*—Ronald L. Drumheller

[57] ABSTRACT

A D/A converter of a current output type desirably compensates for changes in the switching characteristic that arise in each constant current circuit. The D/A converter generates an analog output current that is in response to the level of input digital data and outputs it from an output side by switching each of output currents of a plurality of constant current circuits either to the output side or to a non-output side, in response to the input digital data. The D/A converter performs feedback control, for values of the output currents for the constant current circuits, based on an analog output current at the non-output side during a period when the output currents of all of the constant current circuits are connected to the non-output sides.

7 Claims, 6 Drawing Sheets

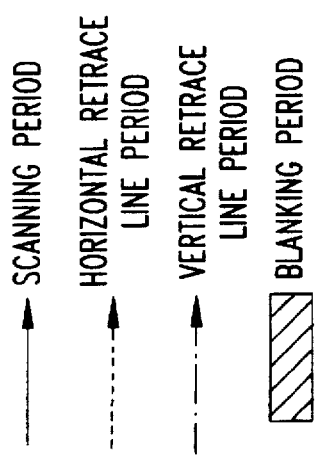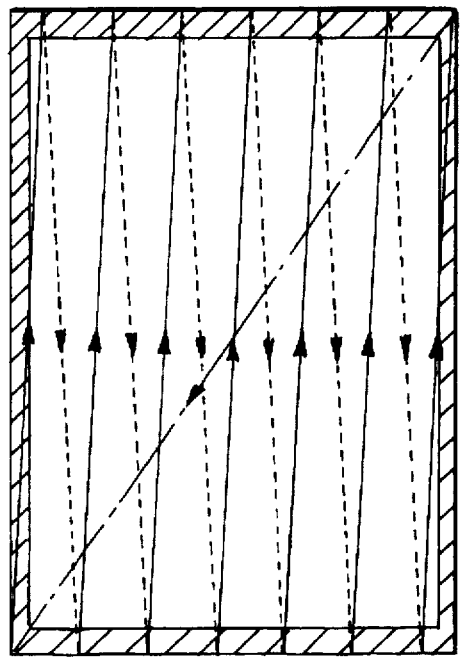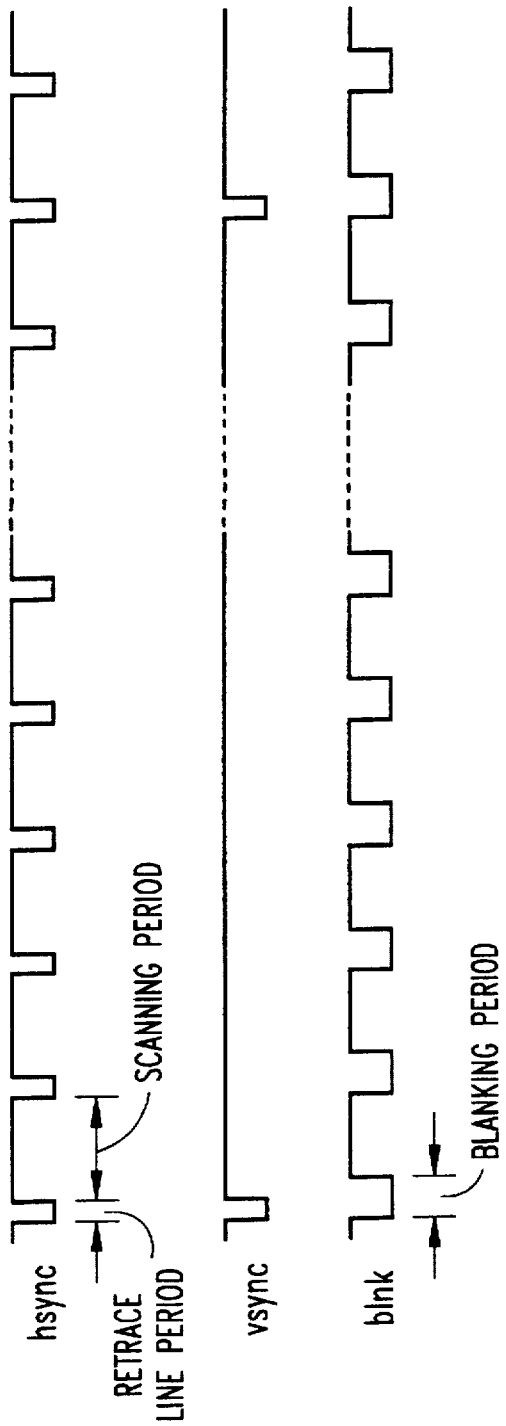
FIG.5A
FIG.5B

DAC WITH FEEDBACK CONTROL FOR CURRENT SOURCE BIAS DURING NON-DISPLAY PERIOD

BACKGROUND OF THE INVENTION

1. Field of the Invention

The present invention relates to a D/A converter that converts a digital signal into an analog signal, and in particular to a D/A converter of a current output type that converts a digital signal into an analog current that is proportional to the value of the received digital signal. More specifically, the present invention relates to a D/A converter that converts a digital signal that is output by a video controller into an analog signal and transmits the analog signal to a CRT display device.

2. Related Art

There is widespread use of information processing apparatuses, such as personal computers, graphic terminals, and word processors, that handle digital signals. The display devices that are employed with such information processing apparatuses are generally LCDs (Liquid Crystal Displays) or CRTs (Cathode Ray Tubes; also called Braun tubes).

A display device and its associated components are extracted from the hardware arrangement of a personal computer and are schematically shown in FIG. 3. Although a personal computer includes other well-known hardware components, it would be understood by one having ordinary skill in the art that for convenience sake those components are excluded in the description of this specification.

In FIG. 3, a CPU 1 executes applications under the control of an operating system (OS). The CPU 1 communicates with other input/output devices via a common signal transfer path that is called an I/O bus 2. A video controller 3, which is one of the input/output devices that are connected to the I/O bus 2, is a peripheral controller that actually performs a drawing process upon the receipt of a drawing command, which is received by the CPU 1 and determines a resolution for a display device. Drawing information that is being processed by the video controller 3 is temporarily stored in a screen buffer that is called a VRAM 4. On the screens of the individual devices, such as an LCD 5 and a CRT 6, data are displayed that correspond to the contents of the VRAM 4. The LCD 5 is driven by digital signals, and a liquid crystal driving circuit (LCDC) 7 outputs a digital drive signal that is in consonance with the drawing information. On the other hand, since the CRT display device 6 is driven by an analog signal, a digital signal that is transmitted by the video controller 3 is converted by a D/A (Digital to Analog) converter 10 into an analog signal, which is then forwarded to the CRT display device 6.

FIG. 4 is a detailed diagram illustrating the peripheral arrangement of the D/A converter 10 in FIG. 3. The color CRT display device 6 is constituted by three-color, RGB (red, green, blue) sets of phosphors that are individually irradiated by three electronic beams (not shown). The D/A converter 10 actually has a circuit arrangement wherein D/A converters 11, 12 and 13 for three channels that correspond to the individual RGB colors. The D/A converters 11, 12 and 13 sequentially receive digital signals, which are consonant with the gray scale levels of the individual colors, from the video controller 3 via their respective bus signal lines 14, 15, and 16. The bus widths of the bus signal lines 14, 15, and 16 correspond to the gray values that are supported. For example, for 256 (=$2^8$) gray scales, the bus signal lines 14, 15 and 16 require an 8-bit width. The D/A converters 11, 12, and 13 generate analog signals (i.e., video signals) with current intensity that correspond to their received digital signals, and output the digital signals to the CRT display device 6 via the output signal lines 20, 21, and 22.

Besides the bus signal lines 14, 15, and 16, the video controller 3 transmits a horizontal sync signal (hsync) 17, a vertical sync signal (vsync) 18 and a blanking signal (blnk) 19 to the D/A converter 10. The horizontal sync signal 17 and the vertical sync signal 18 are employed to reassemble the resolved video signals for scanning. The sync signals 17 and 18 have a scanning period for scanning a phosphorous face with an electronic beam, and a retrace line period for shifting to the next scanning point following the termination of scanning in one direction. The blanking signal 19 is employed to acquire a margin in a scanning area on the phosphorous face and to align its peripheral edge. A period where there is no display due to the blanking signal 19 is called a blanking period. During the retrace line and blanking periods, there is no electronic beam irradiation of the phosphorous face, and thus these are "non-display periods" during which no display is made. It would be easily understood by one having ordinary skill in the art that the D/A converters 11, 12, and 13 output no signal that corresponds to video data during these non-display periods.

FIG. 5A is a specific diagram showing the relationship between the scanning line on the phosphorous face, and the retrace line period and the blanking period. In FIG. 5B are timing charts for the horizontal sync signal 17, the vertical sync signal 18, and the blanking signal 19. The matter shown in FIG. 5 is already well known.

FIG. 6 is a more detailed diagram illustrating the arrangement of the D/A converter 11 for R channel. Although the other D/A converters 12 and 13 for the other two channels are not shown, they have the same arrangement as the D/A converter 11.

In FIG. 6, the D/A converter 11 has 255 constant current circuits $L_1, L_2, \ldots, L_{255}$, and a single decoder 31.

Each of the constant current circuits $L_1, L_2, \ldots$ has one end connected parallel to a stabilized power source $V_{CC}$ and connected in series to a MOSFET switch $S_3$. A property of the FET switch $S_3$ is that a saturated current that can pass between a source and a drain is determined in response to a gate voltage, so that a constant current $I_0$ always flows across each of the constant current circuits $L_1, L_2, \ldots$. A differential circuit that switches output current $I_0$ to either the output side or the non-output side selectively is connected to the other end of each of the constant current circuits $L_1, L_2, \ldots$. Each of the differential circuits includes two MOSFET switches $S_1$ and $S_2$ that are connected in parallel, and the drains of the switches $S_1$ and $S_2$ serve respectively as the output side and the non-output side of the corresponding constant current circuit. A corresponding output signal from the decoder 31 (which will be described later) is inputted without inversion and with inversion to the gates of the respective switches $S_1$ and $S_2$. The switch $S_1$ or $S_2$ is exclusively turned on, and the output current $I_0$ flows through the selected switch to the output side or to the non-output side. The respective output sides and non-output sides of the constant current circuits $L_1, L_2, \ldots$ are collectively connected at an output terminal 41 and a non-output terminal 42 of the D/A converter 11. The current intensity at the output terminal 41 is an analog video signal (R), which is transmitted via a signal line 20 to the CRT display 6. Since the non-output terminal 42 is not required for the driving of the CRT display 6, it is grounded at the GND.

The decoder 31 receives from the video controller 3 an 8-bit digital signal 14 that indicates a gray scale level, and transmits 255 output signals $D_1, D_2, \ldots, D_{255}$ to the differential circuits of the corresponding constant current circuits $L_1, L_2, \ldots, L_{255}$. The decoder 31 enables only the number of output signals among $D_1, D_2, \ldots, D_{255}$ according to the value of the gray scale level, which is indicted by the digital signal 14. When, for example, the level of the digital signal 14 is k (0<k<255), the number of the output signals that are enabled is equivalent to k. As a result, in each of the constant current circuits $L_1, \ldots$, the number of which is equivalent to k out of the 255 circuits, the differential circuit is switched to the output side, and a current having an intensity of $k \times I_0$ flows at the output terminal 41. In each of the remained constant current circuits (255-k), the differential circuit is switched to the non-output side, and a current having an intensity of $(255-k) \cdot I_0$ is collected at the non-output terminal 42. That is, in the D/A converter 11, while a constant current flows across all of the constant current circuits all the time, the current is sometimes switched to the output side in the required amount (i.e., the amount that is equivalent to the inputted digital data) and is added together to provide an output analog current that has a desired intensity. The frequently appearing value 255 $(=2^8-1)$ is derived from the gray values that the video system supports. When a gray value of $2^n$ is supported, the bit width of the input bus 14 of the decoder 31 is n, and the number of both the output signals of the decoder 31 and the number of the constant current circuits are $2^n-1$.

As was previously described, the constant current circuits $L_1, L_2, \ldots$ are designed to supply constant current $I_0$ by employing a saturated current at the FET switches $S_3$. Actually, however, even if the same gate voltage is applied to each of the FET switches $S_3$, the saturated current that is obtained and that passes through is not always the same at each current circuit. The reason is obvious from the general property of a semiconductor device, where the switching characteristic is varied from chip to chip, or within a chip, by the manufacturing process, and the switching characteristic is changed by the fluctuation of the ambient temperature and the power supply voltage. For a video D/A converter, however, the difference among the output currents $I_0$ for one channel also causes a difference between that the D/A converter and D/A converter for another channels. Such difference is displayed on the screen of the CRT display device as an error. Further, in the video D/A converter, the absolute value of the maximum amplitude for the output current is specified. Therefore, it is necessary for the switching characteristic of the FET switches $S_3$ to be compensated for in order that the constant current circuits always output a constant current.

For this reason, in FIG. 6, for example, a compensator 33 is additionally provided to compensate for the switching characteristics of the FET switches $S_3$, and in response to an instruction from the compensator 33, a gate voltage generator 32 supplies a gate voltage at a proper level to the switches $S_3$ to control the output current $I_0$. To appropriately compensate for the switching characteristics of the FET switches $S_3$, however, the compensator 33 tends to have a complicated structure, which makes its design and manufacture difficult.

FIG. 7 is a diagram illustrating one example of the D/A converter 11 that realizes the compensation for the current volume (for simplification of the drawing, the decoder 31 is not shown). In FIG. 7, the D/A converter 11 has a constant current circuit $L_M$ for a monitor, in addition to the common constant current circuits $L_1, L_2, \ldots, L_{255}$ that generate video signals 20. In the constant current circuit $L_M$, a switch $S_M$, which is almost the same as the FET switches $S_3$ of the other constant current circuits, is connected in series. The constant voltage power supply $V_{CC}$ is supplied to the source side of the FET switch $S_M$, and the drain side is grounded at the GND via a resistor R ($R=V_{CC} I_0$). The resistor R functions to change to a monitor voltage $V_M$ a monitor current $I_M$ that flows through the constant current circuit $L_M$. A differential amplifier 34 extracts the monitor voltage $V_M$ at point P and receives it at its input terminal that is on the non-inverted voltage side, while it receives referential voltage $V_{ref}$ that is externally generated at the inversion input terminal. A gate voltage that is consonant with the potential difference between the monitor voltage $V_M$ and the referential voltage $V_{ref}$ is supplied to the FET switches $S_3$ of the constant current circuits $L_1, L_2, \ldots,$ and $L_{255}$, and thus the feedback control for the output current $I_0$ is realized. In other words, the method shown in FIG. 7 accomplishes the feedback control indirectly by using the constant current circuit $L_M$, which differs from the constant current circuit that is originally employed for the output. The technique in the current feedback control performed by the D/A converter is disclosed in, for example, "A 10-bit High Speed CMOS DAC MACRnCELL" by A. V. Vogt (IEEE 1989 Custom Integrated Circuits Conference, 6.7. pp. 1, 6, 7,4).

The feedback control shown in FIG. 7, however, is provided with the presumption that the FET switch $S_M$ for a monitor has the same characteristic as the switches $S_3$ of the constant current circuits, and that the current $I_M$ that flows through the constant current circuit $L_M$ for a monitor has the same intensity as the output current $I_0$ that flows through the other constant current circuits $L_1, \ldots$. In other words, the problem concerning the variance in the switching characteristics of the semiconductor switches on a chip is not solved. Therefore, if there is a difference $\Delta I$ in the output current between the switches $S_M$ and $S_3$, because of the variance in the switching characteristics, through the output terminal 41, the difference $\Delta I$, either directly or after being accumulated, appears as luminance fluctuation on the screen and deteriorates image quality. In addition, the current that is consumed by the constant current circuit $L_M$ for a monitor do not relate to an original video signal, and even though it is slight, there is an increase in the power consumption.

SUMMARY OF THE INVENTION

It is one object of the present invention to provide an excellent D/A converter, of a current output type, that converts a digital signal into an analog signal whose value is proportional to the digital signal value.

It is another object of the present invention to provide a D/A converter that converts a digital signal, which is outputted by a video controller, into an analog signal and transmits the analog signal to a CRT display device, and that outputs an analog current at the exact intensity that is consonant with the level of the received digital signal.

It is an additional object of the present invention to provide a D/A converter that obtains an analog output current responsive to the level of inputted digital data by switching either to an output side or a non-output side selectively, in response to the inputted digital data, each of the output currents from a plurality of constant current circuits, and that can preferably compensate for the fluctuation in the switching characteristics that occurs in each of the constant current circuits.

To achieve the above objects, according to a first aspect of the present invention, a D/A converter, which generates an analog output current that is in response to the level of input digital data and outputs it from an output side by connecting each of output currents of a plurality of constant current circuits either to the output side or to a non-output side, in response to the input digital data, wherein: the D/A converter performs feedback control, for values of the output currents for the constant current circuits, based on an analog output current at the non-output side during a period when the output currents for all of the constant current circuits are connected to the non-output sides.

According to a second aspect of the present invention, a D/A converter, which generates an analog output current that is in response to the level of input digital data and outputs it from an output side by connecting each of output currents of a plurality of constant current circuits either to the output side or to a non-output side, in response to the input digital data, wherein: the D/A converter performs feedback control, for values of the output currents of the constant current circuits, based on an analog output current at the non-output side during a period when the level of the input digital data is zero.

According to a third aspect of the present invention, a D/A converter, which receives digital input data, a horizontal sync signal, a vertical sync signal, and a blanking signal from a video controller and which connects each of output currents of a plurality of constant current circuits either to an output side or to a non-output side, in response to the digital input data, so that an analog output current that is consonant with the digital input data is acquired at the output side and is outputted to a display device, performs feedback control, for values of the output currents of the constant current circuits, based on an analog output current at the non-output side during a non-display period.

According to a fourth aspect of the present invention, a D/A converter, which acquires an analog output current in response to input digital data, comprises: (a) a decoder for enabling output signals, the number of which is in response to the digital input data; (b) a plurality of constant current circuits, each of which includes a switch for adjusting a passing current in response to an applied gate voltage and a differential circuit for feeding the passing current either to an output side or to a non-output side in response to the output signal that is received from the decoder; (c) an output terminal at which the output sides of the constant current circuits are collectively connected; (d) a non-output terminal at which the non-output sides of the constant current circuits are collectively connected; (e) current-voltage conversion means for converting a current volume at the non-output terminal into a voltage; (f) a differential amplifier for receiving an output voltage from the current-voltage conversion means at an input terminal that is on a non-inverted voltage side, for receiving a predetermined referential voltage at an input terminal that is on an inverted voltage side, and for applying a voltage, which is a difference between the output voltage and the referential voltage, as a gate voltage to the switch of each of the constant current circuits; (g) a capacitor for temporarily holding the output voltage of the differential amplifier; (h) a first switch, which is employed to connect and disconnect the differential amplifier to and from the capacitor; (i) a second switch, which is employed to feed and to cut off an output voltage from the current-voltage conversion means to the input terminal that is on the non-inverted voltage side of the differential amplifier; (j) a third switch, which is employed to feed and to cut off the predetermined referential voltage to the input terminal that is on the inverted voltage side of the differential amplifier; and (k) a controller for opening and closing the first, the second, and the third switches.

With this arrangement of the present invention, a current output type D/A converter is so designed that it performs feedback control for a current volume during a period when the output currents are combined at the non-output side. The greatest advantage of the present invention is its ability to monitor directly the current in the constant current circuit that is originally employed as the output. According to the present invention, the feedback control can be performed accurately on the output current of the D/A converter. Since the original constant current circuit is directly monitored, even if a change in the power supply voltage, the fluctuation of the ambient temperature, and an unavoidable variance in a chip (or between chips) caused during an IC manufacturing process may occur, the various factors that contribute to the variance can be directly and preferably compensated for.

While the output from the non-output side is conventionally wasted electricity that is only grounded at the GND, in the present invention the wasted electricity can be effectively used. Since there is no power consumption by an FET for a monitor which functions only for current intensity control, even through it is slight, the power saving can be realized.

When the present invention is employed in a personal computer, for example, as a D/A converter that converts a digital video signal into an analog signal, feedback control on the amount of current that is outputted across the constant current circuits can be performed during a so-called "non-display period," such as a retrace line period, for horizontal and vertical scanning, and a blanking period. Since during such a non-display period the currents that are outputted across all of the constant current circuits are switched to the non-output sides, the feedback control can be performed by directly using the full scale value of the current that is outputted by the D/A converter.

Other objects, features and advantages will become apparent during the following detailed description of the embodiment of the present invention that is given while referring to the accompanying drawings.

BRIEF DESCRIPTION OF THE DRAWINGS

FIG. 5A is a specific diagram showing the relationship between a scanning line on a phosphorous face, and a retrace line period and a blanking period.

FIG. 5B is a timing chart for a horizontal sync signal 17, a vertical sync signal 18, and a blanking signal 19.

DESCRIPTION OF THE PREFERRED EMBODIMENT

Figure 1:
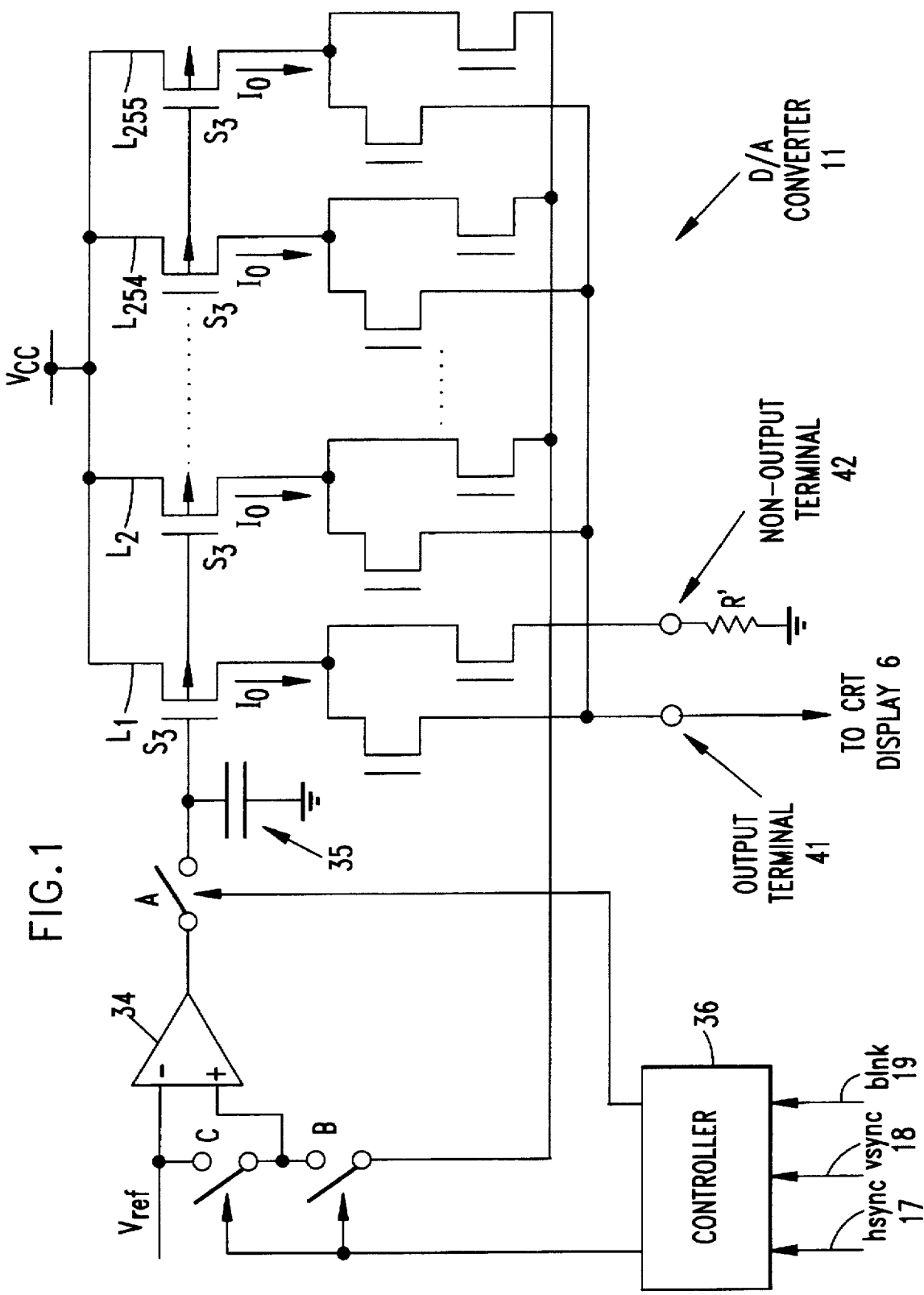
FIG. 1 is a diagram illustrating the arrangement of a D/A converter 11 that is employed to carry out the present invention.

One embodiment of the present invention will now be described in detail while referring to the drawings.

Figure 7:
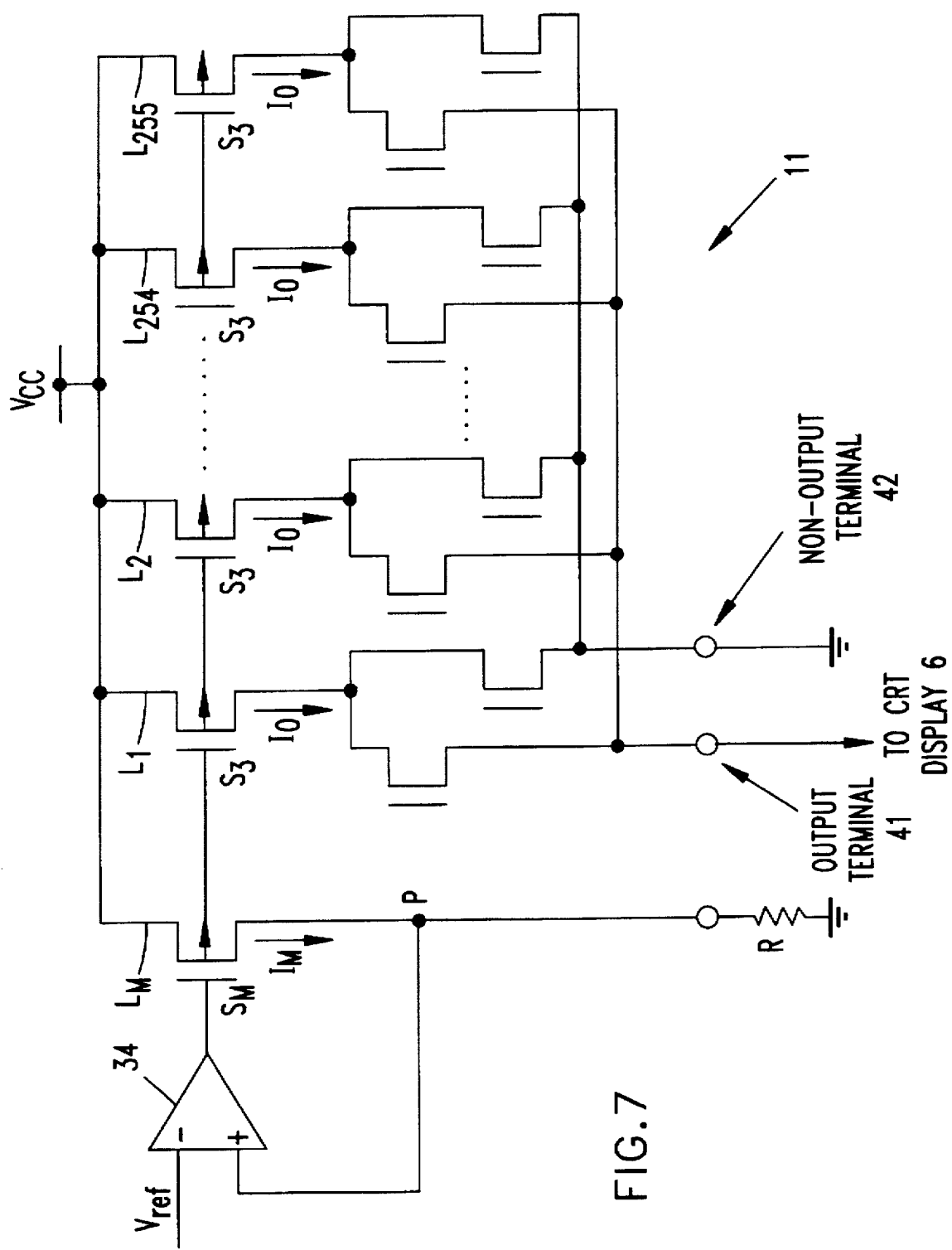
FIG. 7 is a diagram illustrating one example of the D/A converter 11 in which a compensator 32 is provided.

FIG. 1 is a diagram illustrating the D/A converter 11 that is employed to carry out the present invention (for simplification of the drawing a decoder 31 is not shown). The same reference numbers as are used in FIG. 7 are also used for corresponding or identical components. The differences in structure between the present invention and the prior art in FIG. 7 are:

(a) that a constant current circuit for a monitor to compensate for a current value is not provided;
(b) that the output current of a non-output terminal 42 is converted into a voltage at a resistor R' and the converted voltage is transmitted to the input terminal that is on a non-inverted voltage side of a differential amplifier 34;
(c) that a switch A is provided to feed and to cut off the output of the differential amplifier 34;
(d) that a capacitor 35 is provided to temporarily maintain the level of the output voltage of a differential amplifier A;
(e) that switches B and C are provided to switch the non-inverted input terminal of the differential amplifier 34 either to a non-output terminal 42 of the D/A converter 11 or to the inverted input terminal of the amplifier 34; and
(f) that a controller 36 is provided to control the switches A, B, and C.

As is described above, since the output of the differential circuit of each of the constant current circuits $L_1, \ldots$ is switched to the non-output side during a non-display period, such as a retrace line period or a blanking period, all the output currents (=255×$I_0$) are collected at the non-output terminal 42, and the output current is converted into a voltage across the resistor R'.

The controller 36 is used to open and close the switches A, B, and C. More specifically, the controller 36 receives at least one of a horizontal sync signal 17, a vertical sync signal 18, and a blanking signal 19, and determines whether or not it is during a display period or during a non-display period. If it is during a non-display period, the controller 36 closes the switches A and B and opens the switch C. If it is during a display period, the controller 36 opens the switches A and B and closes the switch C.

When the switches A and B are closed and the switch C is opened, the output current at the non-output terminal 42 is converted into a voltage at the resistor R' and the voltage is fed to the input terminal that is on the non-inverted voltage side of the differential amplifier 34. The differential amplifier 34 then applies a gate voltage, which is consonant with a difference between the received voltage and the referential voltage $V_{ref}$ to the switches $S_3$. As a result, the output current $I_0$ of each of the constant current circuits $L_1, \ldots$ is adjusted. Through this process, an electric potential that is equivalent to that at the output terminal of the differential amplifier 34 is held in the capacitor 35.

When the switches A and B are opened and the switch C is closed, the differential amplifier 34 has the same input at its inverted voltage side and at its non-inverted voltage side, the output for the difference becomes zero. Since the electric potential that is equal to the output of the differential amplifier 34 immediately before the switches A and B are opened is held by the capacitor 35, this potential is fed as a gate voltage to the switches $S_3$. Consequently, in this condition the output current $I_0$ of each of the constant current circuits $L_1, \ldots$ is determined by employing the potential that is held by the capacitor 35.

The switches A, B, C can be constituted by using switching devices, such as MOSFET switches and bipolar transistors.

Figure 2:
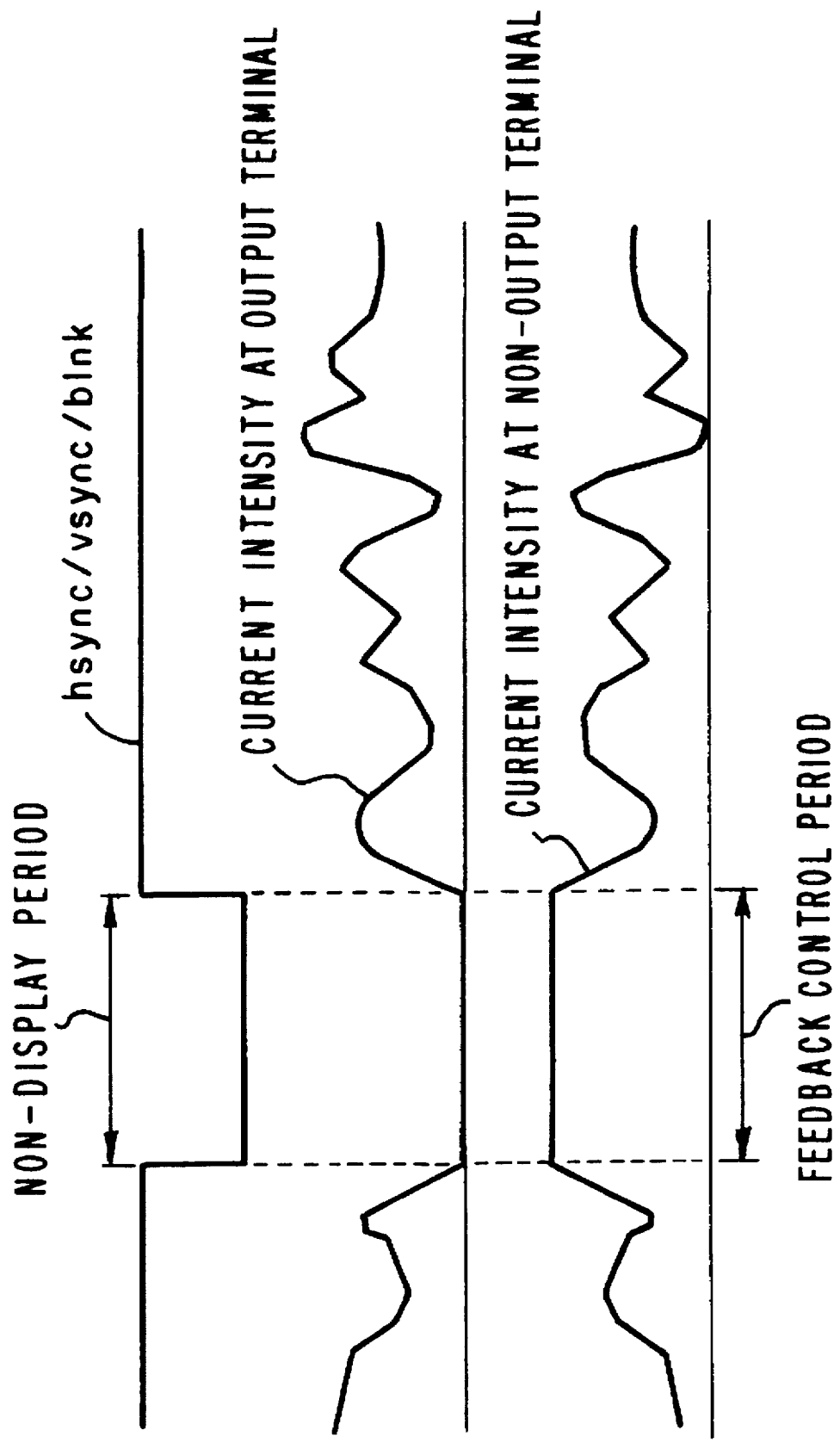
FIG. 2 is a timing chart showing the relationship between a sync signal, an output current at an output terminal 41, and an output current at a non-output terminal.
Figure 3:
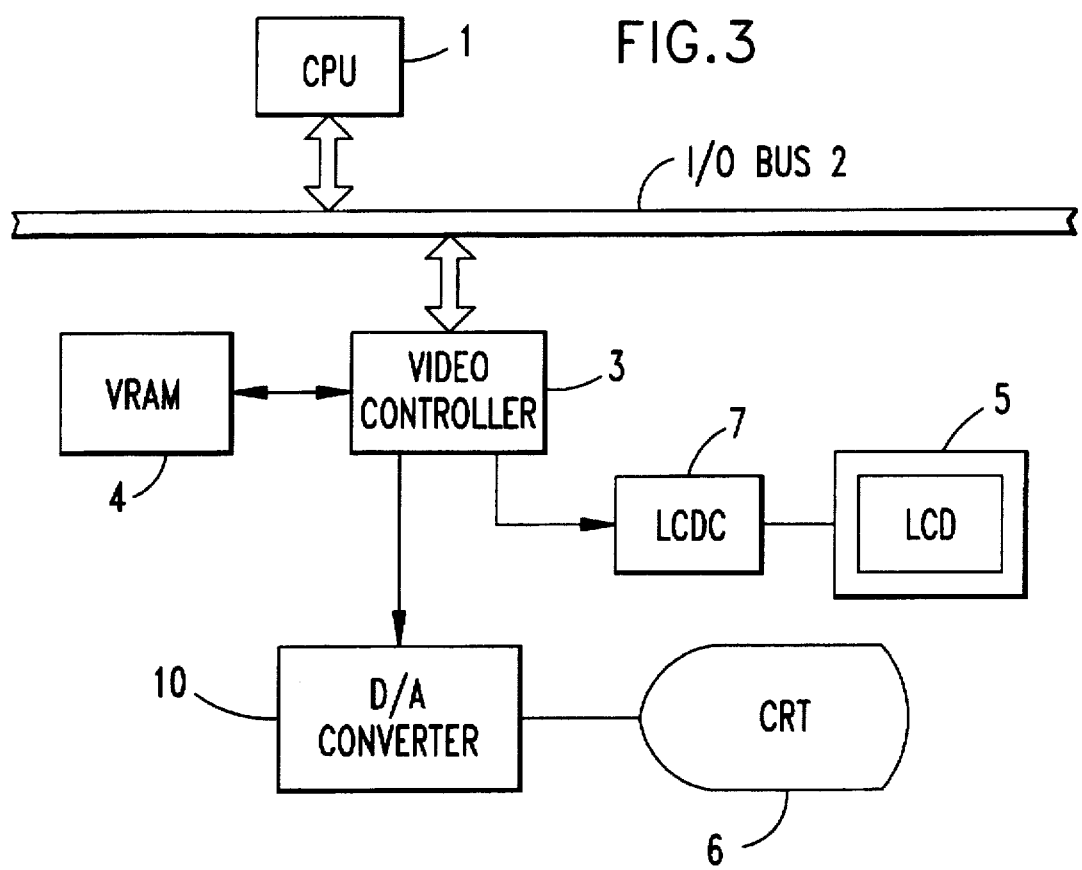
FIG. 3 is a specific diagram illustrating a display device and its associated components in the hardware arrangement of a personal computer.
Figure 4:
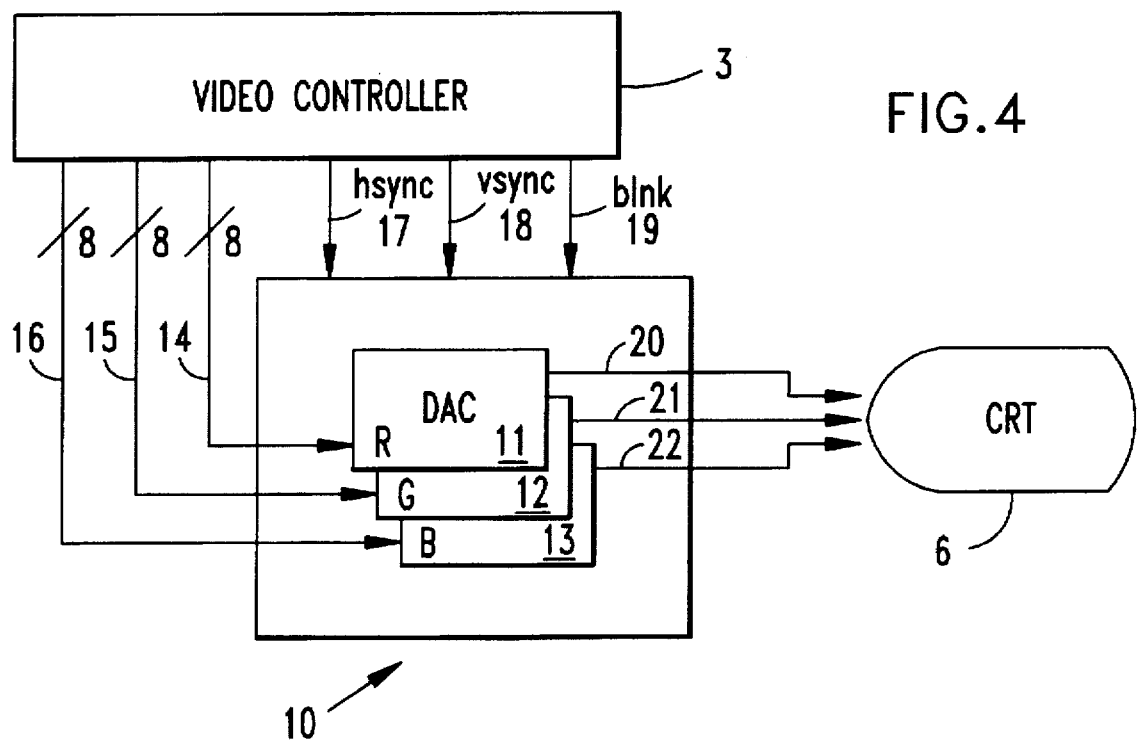
FIG. 4 is a detailed diagram showing the peripheral arrangement of a D/A converter 10 in FIG. 3.
Figure 6:
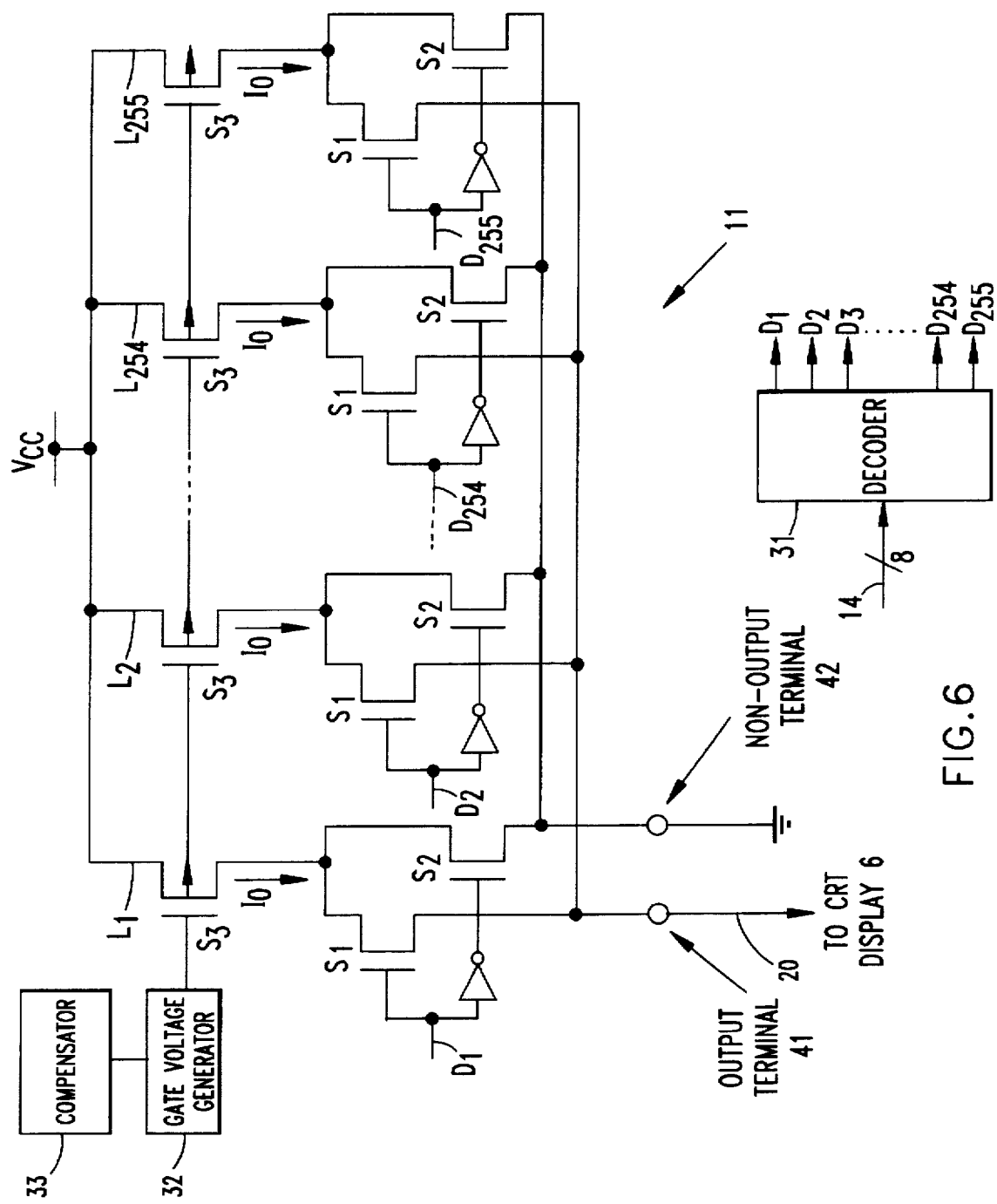
FIG. 6 is a more detailed diagram showing the arrangement of the D/A converter 11.

The processing of the D/A converter 11 in FIG. 1 will now be observed for a non-display period and for a display period. FIG. 2 is a timing chart for the relationship between the sync signal and the output currents at the output terminal 41 and at the non-output terminal 42.

Non-display Period

For the non-display period, the controller 36 closes the switches A and B and opens the switch C. Also, all of the differential circuits of the constant current circuits $L_1, L_2, \ldots L_{255}$ are switched to the non-output side (see FIG. 2), and all the output currents (=255×$I_0$) are collected at the non-output terminal 42. The output current at the non-output terminal 42 is converted into a voltage at the resistor R', and the voltage is supplied via the switch B to the input terminal that is on the non-inverted voltage side of the differential amplifier 34. The differential amplifier 34 applies a gate voltage, which is consonant with a difference between the voltage and the referential voltage $V_{ref}$ to the switches $S_3$. Therefore, the output current $I_0$ of each of the constant current circuits $L_1, \ldots$ is directly monitored and feedback control is performed for the output current.

Display Period

For the display period, the controller 36 opens the switches A and B and closes the switch C. As a result, the differential amplifier 34 receives the same input at the inverted voltage side and at the non-inverted voltage side, and the output difference becomes zero. The capacitor 35 holds an electric potential that is equivalent to the output of the differential amplifier 34 immediately before the switches A and B have been opened (i.e., during the non-display period), and this potential serves as a gate potential for the switches $S_3$. Thus, in the display period, the output current $I_0$ of each of the constant current circuits $L_1, \ldots$ is controlled in response to the final output current during the non-display period.

That is, during a non-display period such as a horizontal/vertical retrace line period or a blanking period, the D/A converter 11 is subjected to feedback control, and the gate voltage at each of the FET switches $S_3$ of the constant current circuits $L_1, \ldots$ is corrected to an optimal value by the feedback control. During other display periods, the D/A converter 11 is in a hold state and a steady gate voltage at the switch $S_3$ is maintained.

In the above embodiment, only the D/A converter 11 for one channel (Red) has been explained. It would, however, be understood by one having ordinary skill in the art that the present invention can be applied in the same manner for the D/A converters 12 and 13 for the other two channels (Green and Blue), and that an error that arises between channels can be preferably eliminated by applying the present invention.

The present invention has been described in detail while referring to the specific embodiment. However, it should be obvious to one having ordinary skill in the art that various modifications or revisions of the embodiment are possible within the scope of the present invention. That is, although the present invention has been disclosed by using an example, it should not be limited to that example. To understand the subject of the present invention, claims should be referred to.

As is described above in detail, according to the present invention, it is possible to provide an accurate D/A converter that can directly and preferably compensate for various difference factors, such as a change in a power supply voltage, the fluctuation of the ambient temperature, and a variance in a chip, or between chips, that cannot be avoided during an IC manufacturing process. The effect obtained by the present invention is derived from the direct monitoring of the output current of a constant current circuit that is employed originally as an output.

While conventionally the output from the non-output side is wasted power that is grounded, according to the present invention the wasted electricity can be effectively used.

Since there is no extra power consumed for only controlling a current value, even though it is slight, the power saving can be realized.

When the present invention is applied to a D/A converter, such as for a personal computer, that converts a digital video signal into an analog signal, a so-called "non-display period," such as a horizontal or a vertical retrace line period or a blanking period, is employed to perform feedback control on the output current value of the constant current circuit. In such a non-display period, the output current of each of the constant current circuits is switched to the non-output side, so that feedback control can be performed by directly using the full-scale output current value of the D/A converter.

We claim:

1. A D/A converter, which generates an analog output current that is in response to the level of input digital data and outputs it from an output side by connecting each of output currents of a plurality of constant current circuits either to said output side or to a non-output side, in response to said input digital data, wherein: said D/A converter performs feedback control, for values of said output currents for said constant current circuits, based on an analog output current at said non-output side during a period when said output currents of all of said constant current circuits are connected to said non-output sides.

2. A D/A converter, which generates an analog output current that is in response to the level of input digital data and outputs it from an output side by connecting each of output currents of a plurality of constant current circuits either to said output side or to a non-output side, in response to said input digital data, wherein: said D/A converter performs feedback control, for values of said output currents of said constant current circuits, based on an analog output current at said non-output side during a period when said level of said input digital data is zero.

3. A D/A converter, which receives digital input data, a horizontal sync signal, a vertical sync signal, and a blanking signal from a video controller and which connects each of output currents of a plurality of constant current circuits either to an output side or to a non-output side, in response to said digital input data, so that an analog output current that is consonant with said digital input data is acquired at said output side and is outputted to a display device, and which performs feedback control, for values of said output currents of said constant current circuits, based on an analog output current at said non-output side during a non-display period.

4. A D/A converter according to claim 3, wherein said non-display period is a retrace line period that is indicated by said horizontal and said vertical sync signals.

5. A D/A converter according to claim 3, wherein said non-display period is a blanking period that is indicated by said blanking signal.

6. A D/A converter, which acquires an analog output current in response to input digital data, comprising:

(a) a decoder for enabling output signals, the number of which is in response to said digital input data;

(b) a plurality of constant current circuits, each of which includes a switch for adjusting a passing current in response to an applied gate voltage and a differential circuit for feeding said passing current either to an output side or to a non-output side in response to said output signal that is received from said decoder;

(c) an output terminal at which said output sides of said constant current circuits are collectively connected;

(d) a non-output terminal at which said non-output sides of said constant current circuits are collectively connected;

(e) current-voltage conversion means for converting a current volume at said non-output terminal into a voltage;

(f) a differential amplifier for receiving an output voltage from said current-voltage conversion means at an input terminal that is on a non-inverted voltage side, for receiving a predetermined referential voltage at an input terminal that is on an inverted voltage side, and for applying a voltage, which is a difference between said output voltage and said referential voltage, as a gate voltage to said switch of each of said constant current circuits;

(g) a capacitor for temporarily holding said output voltage of said differential amplifier;

(h) a first switch, which is employed to connect and disconnect said differential amplifier to and from said capacitor;

(i) a second switch, which is employed to feed and to cut off an output voltage from said current-voltage conversion means to said input terminal that is on said non-inverted voltage side of said differential amplifier;

(j) a third switch, which is employed to feed and to cut off said predetermined referential voltage to said input terminal that is on said inverted voltage side of said differential amplifier; and (k) a controller for opening and closing said first, said second, and said third switches.

7. A D/A converter according to claim 6, wherein in a period when said output currents of said plurality of constant current circuits are collectively connected at said non-output terminal, said controller closes said first and said second switches and opens said third switch, wherein in a period other than said period, said controller opens said first and said second switches and closes said third switch.

* * * * *